United States Patent [19]

Luetzelschwab et al.

[11] 4,251,784
[45] Feb. 17, 1981

[54] APPARATUS FOR PARALLEL COMBINING AN ODD NUMBER OF SEMICONDUCTOR DEVICES

[75] Inventors: Roland C. Luetzelschwab; Patrick E. Bartell, both of Bedford, Tex.

[73] Assignee: Motorola, Inc., Schaumburg, Ill.

[21] Appl. No.: 89,066

[22] Filed: Dec. 17, 1979

[51] Int. Cl.$^3$ ............................................... H01P 5/12
[52] U.S. Cl. .................................... 333/127; 330/286; 330/295; 333/128
[58] Field of Search .................. 328/104, 105; 330/53, 330/286, 295; 331/56; 333/124, 125, 127, 128, 136

[56] References Cited

U.S. PATENT DOCUMENTS

| | | | |
|---|---|---|---|
| 3,764,940 | 10/1973 | Vergnolle | 333/124 |
| 3,784,932 | 1/1974 | Wisherd | 333/127 |

Primary Examiner—Paul L. Gensler
Attorney, Agent, or Firm—Edward M. Roney; James W. Gillman

[57] ABSTRACT

The collectors or the bases of three RF power transistors, each mounted on a separate substrate, are connected in parallel by means of transmission line segments connected so that the current flowing in the center transistor splits evenly and joins the current from the end transistors at an initial combining point, which points are then connected to a final combining point to provide the shortest transmission lines to the initial and final combining points.

13 Claims, 3 Drawing Figures

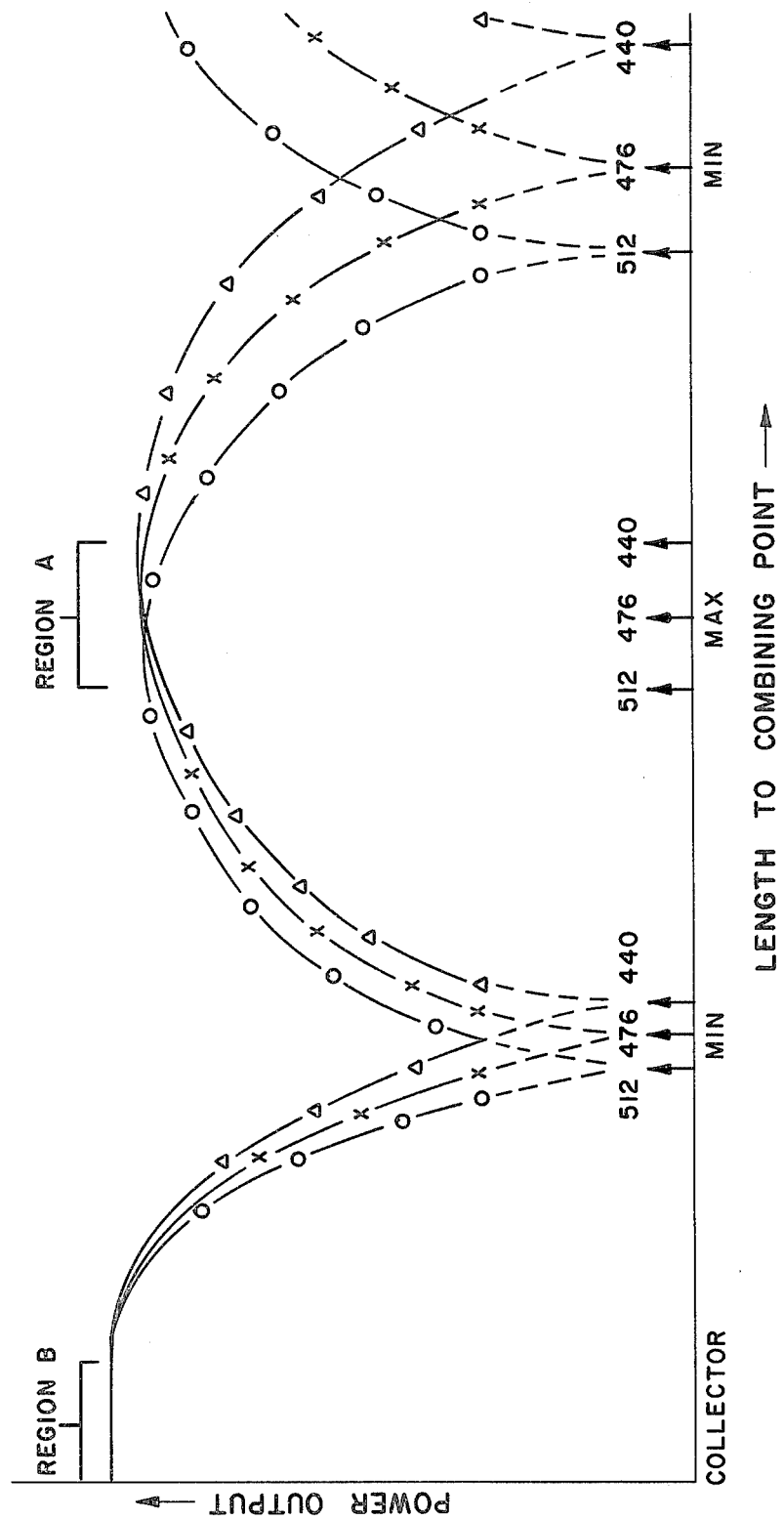

APPARATUS FOR PARALLEL COMBINING AN ODD NUMBER OF SEMICONDUCTOR DEVICES

BACKGROUND OF THE INVENTION

In prior art devices for parallel combining RF power transistors, an even number of transistors, generally four, are combined by using a symmetrical transmission line matching network. A typical example of a four transistor combining network is disclosed in U.S. Pat. No. 3,784,932, issued Jan. 8, 1974 and entitled "Parallel Transmission Line Matching Network for Connecting Together a Plurality of RF Amplifier Transistors". In general, these prior art combining networks are relatively expensive because of the use of an additional transistor and the associated extra circuitry.

Some work has been done in the past to combine three semiconductor devices using three equal length lines generally configured so as to radiate from a single combining point. However, these are unsatisfactory because of the extreme length of the lines, which causes a physical problem (placing the lines) and an electrical problem (as will be explained in more detail presently).

SUMMARY OF THE INVENTION

The present invention pertains to apparatus for parallel combining an odd number of semiconductor devices (generally three instead of four, etc) through transmission line segments which are constructed to divide the current in intermediate transistors to combine with the current of end transistors at initial combining points with the initial combining points being connected to a final combining point so that the transmission line from each semiconductor device to the initial combining point is generally as short as possible. By connecting each similar terminal of the semiconductor devices, collectors or bases, with the shortest transmission lines the maximum power and efficiency performance over a chosen range of frequencies is obtained with an odd number of semiconductor devices. Because the number of semiconductor devices and the associated extra circuitry is reduced, the cost and size of the apparatus are reduced.

It is an object of the present invention to provide new and improved apparatus for parallel combining an odd number of semiconductor devices.

It is a further object of the present invention to provide apparatus for parallel combining an odd number of semiconductor devices whereby fewer semiconductor devices and less associated circuitry is required.

It is a further object of the present invention to provide apparatus for parallel combining an odd number of semiconductor devices wherein similar terminals of each device are connected by the shortest transmission lines to a final combining terminal.

These and other objects of this invention will become apparent to those skilled in the art upon consideration of the accompanying specification, claims and drawings.

BRIEF DESCRIPTION OF THE DRAWINGS

Referring to the drawings:

FIG. 2 is a graph of typical curves for power out versus length of the combining network.

DESCRIPTION OF THE PREFERRED EMBODIMENT

Figure 1:
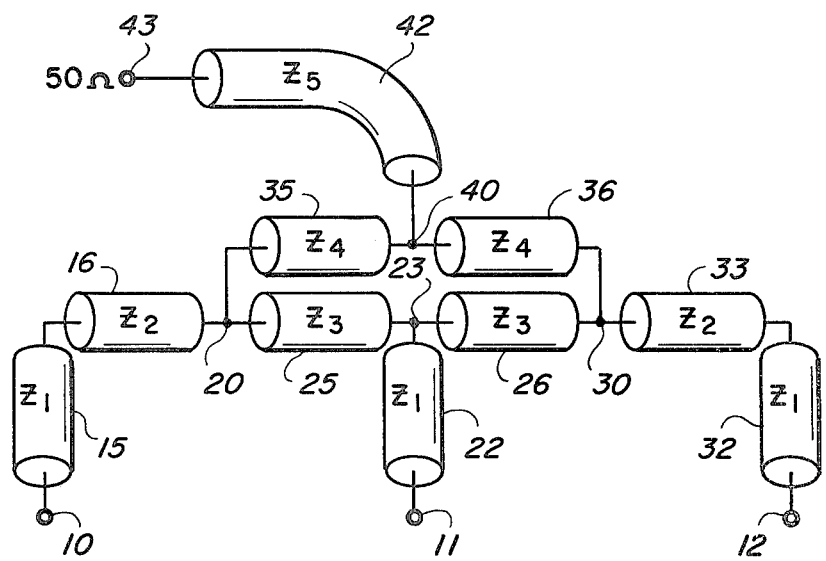
FIG. 1 is a representative view of apparatus for parallel combining three semiconductor devices, which apparatus embodies the present invention.

Referring specifically to FIG. 1, a three transistor parallel combining network is illustrated diagrammatically. In this FIGURE the network is made up of transmission line sections illustrated as discrete impedances. Three terminals 10, 11 and 12 are adapted to be connected to similar terminals of a semiconductor device, such as the collectors or bases of three RF power transistors. The terminal 10 is connected through a first impedance 15 and a second impedance 16, connected in series, to an initial combining point 20. The second terminal 11 is connected through an impedance 22 to a junction point 23 which is connected through an impedance 25 to the initial combining point 20 and through an impedance 26 to a second initial combining point 30. The third terminal 12 is connected through an impedance 32 and an impedance 33, connected in series, to the second initial combining point 30. Each of the initial combining points 20 and 30 are connected through impedances 35 and 36, respectively, to a final combining point 40. Each of the impedances 15, 22 and 32 are similar. The two impedances 16 and 33 are similar. The two impedances 25 and 26 are similar and the two impedances 35 and 36 are similar. In general, the similar impedances are formed by utilizing equal lengths of similar transmission lines.

Initial efforts at paralleling a plurality of semiconductor devices indicated that the length from the devices to a combining point affected the performance. Experiments were performed using two paralleled devices that allowed the length from the device to a combining point to be varied from as short as physically possible (½ inch) to a little more than one wavelength at the desired band center. It was discovered that the results of the power out versus the length from the device to the combining point were generally sinusoidal in nature, as shown in FIG. 2, and showed that each frequency required a different length for optimum performance, with the curves converging at the terminals of the devices. Although the devices could be paralled in the region marked A of FIG. 2, the performance is generally not good enough to cover the desired band (440 to 512 megahertz in this example) plus overlap for construction tolerances. A small change in the device output impedance or a phase shift through the device, although not significantly affecting the final match, could cause poor combining by causing the resultant phase shift to the combining point to be changed enough to be in a poor combining region at the high or low edge of the band. It is believed that a 90° phase shift from the device output terminal to a combining point causes the minimum power output nodes illustrated in FIG. 2, for example. Thus, if the devices were to be paralleled in region A and the transmission lines were formed as microstrips on a printed circuit board, the tolerances of substrate thickness, dielectric constant, collector capacitors, and transmission line widths and lengths must be held to tight tolerances to prevent poor combining. Therefore, in order to achieve the desired bandwidth, plus minimize manufacturing and component tolerances, the devices must be paralleled as close to each other as possible, which corresponds to the region marked B in FIG. 2. Generally, the length of the region B will depend upon the wavelength of the frequencies of interest but it is believed that approximately 1.5 inches will be a maximum length for implementation in the 440 to 512 megahertz band using microstrip transmission lines on alumina substrates. It should be noted that the length to the combining point alone does not determine performance. Performance is determined by the voltage (or current) phase shift to the combining point, which depends on the device output impedance, collector capacitance, impedance of the transmission line and the length of the transmission line to the combining point.

Any current flowing through the impedance 22 splits at the junction 23 (whether it is flowing into or out of the impedance 22) and flows equally through the two equal paths formed by impedances 25 and 26. The equally divided current joins with currents flowing in the end impedances 15 and 32 at the initial combining points 20 and 30 to provide the shortest possible length of transmission line for in-line devices. Thus, an odd number of semiconductor devices can be combined with the apparatus illustrated in FIG. 1 wherein the devices are positioned in-line with two end devices and at least one intermediate device connected so that substantially the shortest possible length of transmission line is used to connect each of the devices to initial combining points located intermediately between the devices. The two impedances 35 and 36 connecting the initial combining points 20 and 30 to the final combining point 40 should be as short as possible and generally shorter than any of the combination of impedances from the semiconductor devices to the initial combining points 20 or 30. Also, the length of the transmission lines forming impedances 15 and 16 should be equal to the length of the transmission lines forming impedances 22 and 25, 22 and 26, and 32 and 33. In addition to the above requirements, the value of either of the impedances 25 or 26 (both of which are equal) must be equal to twice the value of either of the impedances 16 or 33 (both of which are equal), since the current flowing through either of the impedances 25 or 26 is only one-half as much as the current flowing through either of the impedances 16 or 33.

Either graphical techniques using a Smith chart or a computer aided design can be used to transform the device output impedance at the final combining point 40 to a desired impedance. In FIG. 1 the transforming impedance is designated 42 and is connected from the final combining point 40 to an output terminal 43 which is generally terminated in 50 ohms. Generally, the impedances will be transmission lines, such as microstrip, formed on a printed circuit board or the like and the width of the transmission lines forming the impedances 15, 16, 22, 25, 26, 32, 33, 35, 36, and 42 as well as the length of the transmission line forming the impedance 42 will be dictated by the output impedances of the semiconductor devices connected to the terminals 10, 11 and 12, and the size, width and dielectric constant of the board material used.

Figure 3:
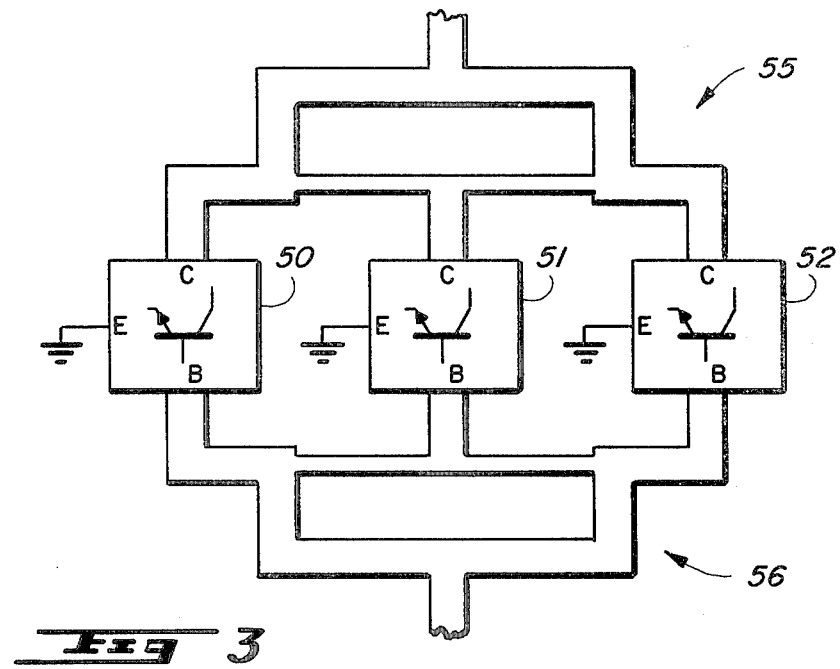
FIG. 3 is a view in top plan of a printed circuit board, portions thereof broken away, illustrating an actual combining circuit embodying the apparatus illustrated in FIG. 1.

Referring to FIG. 3, specific structure utilizing the concepts set forth in conjunction with FIG. 1 is illustrated. Three semiconductor devices 50, 51 and 52 are mounted in-line. In this embodiment the three semiconductor devices are RF power transistors premounted in a package, a typical embodiment of which is described in U.S. Pat. No. 3,996,603, issued Dec. 7, 1976 and entitled "RF Power Semiconductor Package and Method of Manufacture". In the embodiment of FIG. 3 the output power of the collectors of the semiconductor devices 50, 51 and 52 is combined by means of a combining network, generally designated 55, and the driving power to the bases of the semiconductor devices 50, 51 and 52 is applied through a parallel combining network, generally designated 56. Both combining networks 55 and 56 are constructed in accordance with the above description of FIG. 1. Thus, improved apparatus for parallel combining an odd number of semiconductor devices is disclosed wherein substantially the shortest possible connection between similar terminals and initial combining points are utilized to maximize the power output and efficiency performance over a desired frequency range. Since the present apparatus accomplishes essentially the same performance as the prior art accomplished with four transistors, a considerable saving in cost and associated extra circuitry is realized.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of the invention.

We claim:
1. Apparatus for parallel combining three semiconductor devices through connections to a similar terminal of each device, the apparatus comprising:
   (a) means for positioning the devices generally in line so as to provide two end devices and one intermediate device;
   (b) pluralities of first, second, third and fourth transmission line segments, each of said first, second, third and fourth segments having approximately equal lengths and impedances, respectively;
   (c) an initial combining point defined intermediately between each adjacent pair of devices by the juncture of a first and second transmission line segment extending from each similar terminal of the two end devices and a first and two third transmission line segments extending from each similar terminal of the intermediate devices, the combined length of the first and second transmission line segments being approximately equal to the combined length of the first transmission line segment with each of the two third transmission line segments and the impedance of each third transmission line segment being approximately equal to twice the impedance of each second transmission line segment; and
   (d) a final combining point defined by the juncture of all of the fourth transmission line segments extending from each of said initial combining points.

2. Apparatus as claimed in claim 1 wherein the semiconductor devices are transistors and the similar terminals are collectors with the final combining point forming an output.

3. Apparatus as claimed in claim 1 wherein the semiconductor devices are transistors and the similar terminals are bases with the final combining point forming an input for the base drive.

4. Apparatus as claimed in claim 3 wherein the transistors also have similar apparatus similarly connected to collector terminals thereof.

5. Apparatus as claimed in claim 1 wherein the first, second, third and fourth transmission line segments are formed from microstrip.

6. Apparatus as claimed in claim 5 wherein the means for positioning the devices includes a printed circuit board with the microstrip formed therein.

7. Apparatus as claimed in claim 1 including in addition a fifth transmission line segment connected to the final combining point and providing a desired matching impedance.

8. Apparatus as claimed in claim 1 wherein the apparatus is designed to operate over a band of frequencies and the length of each of the combined first and second transmission line segments is substantially less than the length required to provide a 90° phase shift at the high end of the band.

9. Apparatus as claimed in claim 1 wherein the length of each of the combined first and second transmission line segments is less than approximately 1.5 inches.

10. Apparatus as claimed in claim 1 wherein the length of each of the fourth transmission line segments is substantially less than the length required to provide a 90° phase shift at the high end of the band.

11. Apparatus as claimed in claim 1 wherein the length of each of the fourth transmission line segments is substantially less than 1.5 inches.

12. Apparatus as claimed in claim 1 wherein the semiconductor devices are RF power transistors.

13. Apparatus for parallel combining an odd number of semiconductor devices through connections to a similar terminal of each device, the apparatus comprising:
  (a) means for positioning the devices generally in-line so as to provide two end devices and at least one intermediate device;
  (b) pluralities of transmission line segments;
  (c) a plurality of initial combining points equal to one less than the number of devices being combined, said initial points being defined intermediately between each adjacent pair of devices by the juncture of transmission line segments extending from each similar terminal of the devices adjacent the initial combining points and a transmission line segment extending to a next level of combining, the impedance of the transmission line segments being such as to cause current in each of the intermediate devices to flow equally at each of the two initial combining points adjacent thereto; and
  (d) adjacent pairs of combining points being connected by transmission line segments joined to form a combining point in a next level of combining with the final level of combining having a single combining point therein.

* * * * *